(12) United States Patent
Shimizu

(10) Patent No.: US 9,000,867 B2
(45) Date of Patent: Apr. 7, 2015

(54) ACOUSTIC WAVE DEVICE AND MODULE

(75) Inventor: Yohei Shimizu, Kanagawa (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 317 days.

(21) Appl. No.: 13/590,890

(22) Filed: Aug. 21, 2012

(65) Prior Publication Data
US 2013/0049889 A1    Feb. 28, 2013

(30) Foreign Application Priority Data

Aug. 22, 2011    (JP) .................. 2011-180805

(51) Int. Cl.
*H03H 3/10* (2006.01)
*H03H 9/02* (2006.01)

(52) U.S. Cl.
CPC ............. *H03H 3/10* (2013.01); *H03H 9/02574* (2013.01); *H03H 9/02834* (2013.01)

(58) Field of Classification Search
CPC ...... H01L 41/313; H01L 41/338; H03H 3/08; H03H 3/10
See application file for complete search history.

(56) References Cited

U.S. PATENT DOCUMENTS

| 2004/0226162 | A1 | 11/2004 | Miura et al. | |
|---|---|---|---|---|
| 2011/0006638 | A1* | 1/2011 | Ostrovskii et al. | 310/320 |
| 2012/0069876 | A1* | 3/2012 | Kamizuma et al. | 375/219 |

FOREIGN PATENT DOCUMENTS

| JP | 2002-9584 A | 1/2002 |
|---|---|---|
| JP | 2004-343359 A | 12/2004 |

\* cited by examiner

*Primary Examiner* — Stephen E Jones
*Assistant Examiner* — Ryan I Clark
(74) *Attorney, Agent, or Firm* — Chen Yoshimura LLP

(57) ABSTRACT

An acoustic wave device includes: a support substrate composed of lithium tantalate in multi-polarization condition; an element substrate that is provided on an upper face of the support substrate and is composed of lithium tantalate, a lower face of the element substrate being jointed to the upper face of the support substrate; and a comb-like electrode that is provided on an upper face of the element substrate and excites an acoustic wave.

9 Claims, 11 Drawing Sheets

ACOUSTIC WAVE DEVICE AND MODULE

CROSS-REFERENCE TO RELATED APPLICATION

This application is based upon and claims the benefit of priority of the prior Japanese Patent Application No. 2011-180805, filed on Aug. 22, 2011, the entire contents of which are incorporated herein by reference.

FIELD

A certain aspect of the present invention relates to an acoustic wave device and a module, and in particular, relates to an acoustic wave device and a module having a comb-like electrode on an element substrate made of lithium tantalate or the like.

BACKGROUND

There is known a surface acoustic wave device as one of acoustic wave devices using an acoustic wave. The surface acoustic wave device has a comb-like electrode formed on a surface of a piezoelectric substrate. The comb-like electrode has a metal strip. The metal strip receives and excites a surface acoustic wave, resonates a surface acoustic wave, or reflects a surface acoustic wave. The surface acoustic wave device is used as a filter of a wireless device such as a mobile phone unit, because the surface acoustic wave device is small and light, and greatly attenuates a signal out of a predetermined frequency band.

As the performance of the mobile phone unit gets higher, improvement of temperature characteristics of the surface acoustic wave device is needed, and reduction of temperature dependence of frequency such as a pass band of a filer and/or a resonance frequency of a resonator is needed. However, a piezoelectric single-crystal material such as lithium tantalate ($LiTaO_3$) of which electromechanical coefficient is large lacks temperature stability.

Japanese Patent Application Publication No. 2004-343359 (hereinafter referred to as Document 1) discloses that a lithium tantalate substrate is jointed on a support substrate made of a sapphire substrate as an element substrate on which a surface acoustic wave element is provided. With the structure, temperature stability of the surface acoustic wave device is improved. On the other hand, Japanese Patent Application Publication No. 2002-9584 (hereinafter referred to as Document 2) discloses that a support substrate and an element substrate are made of a lithium tantalate substrate, a propagation direction of an acoustic wave of the surface acoustic wave element is an X-axis of the element substrate, and an axis direction of the support substrate in parallel with the propagation direction of the acoustic wave is a Z-axis.

SUMMARY OF THE INVENTION

According to an aspect of the present invention, there is provided an acoustic wave device including: a support substrate composed of lithium tantalate in multi-polarization condition; an element substrate that is provided on an upper face of the support substrate and is composed of lithium tantalate, a lower face of the element substrate being jointed to the upper face of the support substrate; and a comb-like electrode that is provided on an upper face of the element substrate and excites an acoustic wave.

According to another aspect of the present invention, there is provided a module including an acoustic wave device having a support substrate, an element substrate and a comb-like electrode, the support substrate being composed of lithium tantalate in multi-polarization condition, the element substrate being provided on an upper face of the support substrate and being composed of lithium tantalate, a lower face of the element substrate being jointed to the upper face of the support substrate, the comb-like electrode being provided on an upper face of the element substrate and exciting an acoustic wave.

DETAILED DESCRIPTION

In Document 1, temperature dependence of frequency of the surface acoustic wave device may be reduced. However, a bulk wave is reflected at an interface between the sapphire substrate and a lithium tantalate substrate. Thus, spurious response may occur. This is because there is a difference between acoustic impedance of the sapphire substrate and acoustic impedance of the lithium tantalate substrate. The acoustic impedance is related to sonic speed and a substrate density of each substrate.

On the other hand, in Document 2, the support substrate and the element substrate are made of lithium tantalate. Therefore, the spurious caused by the acoustic impedance difference as in the case of Document 1 does not occur. Further, the temperature dependence of frequency of the surface acoustic wave device may be reduced by appropriately selecting orientation of the support substrate and the element substrate.

However, the spurious caused by an acoustic wave excited at an interface between the support substrate and the element substrate may occur in the surface acoustic wave device in which the support substrate and the element substrate are made of lithium tantalate.

A description is now be given of embodiments with reference to the accompanying drawings.

Figure 1:
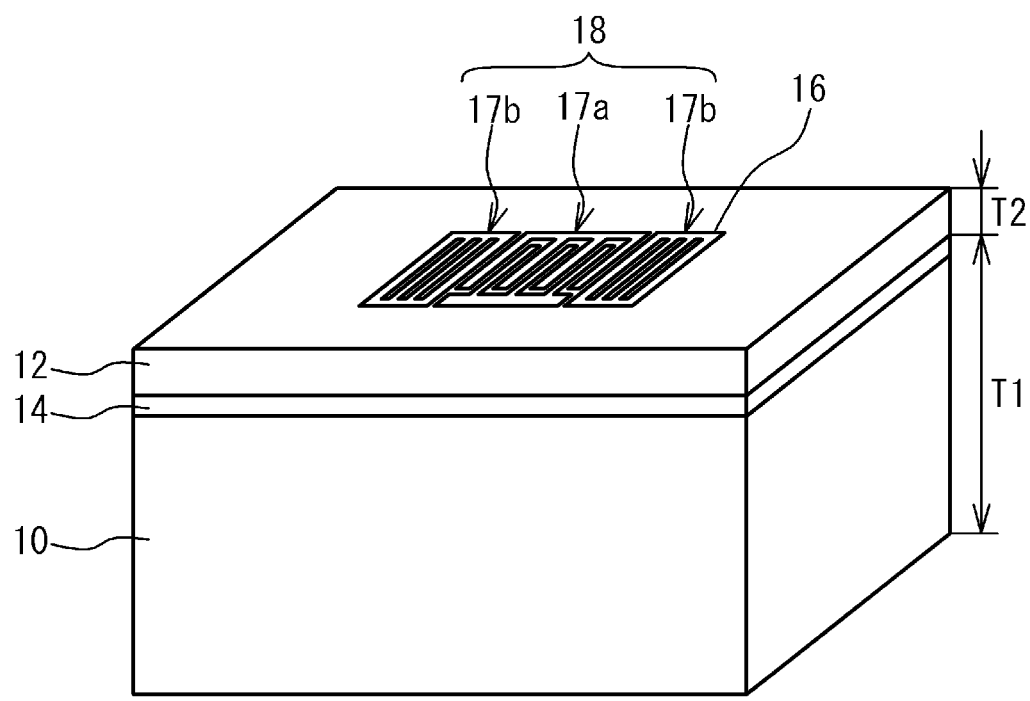
FIG. 1 illustrates a perspective view of an acoustic wave device in accordance with a first embodiment.

FIG. 1 illustrates a perspective view of an acoustic wave device in accordance with a first embodiment. As illustrated in FIG. 1, the acoustic wave device has a structure in which an element substrate 12 having a thickness T2 is provided on an upper face of a support substrate 10 having a thickness T1, and a lower face of the element substrate 12 is jointed to the upper face of the support substrate 10. The support substrate 10 and the element substrate 12 are made of lithium tantalate (LiTaO$_3$). An amorphous layer 14 is provided between the upper face of the support substrate 10 and the lower face of the element substrate 12. The amorphous layer 14 is very thin. Therefore, the thickness of the amorphous layer 14 may be ignorable with respect to the thickness T1 and the thickness T2. However, in FIG. 1, the thickness of the amorphous layer 14 is illustrated in addition to the thickness T1 and the thickness T2.

A single-terminal-pair resonance element 18 is provided on the upper face of the element substrate 12, as a surface acoustic wave element. The single-terminal-pair resonance element 18 has an IDT (Interdigital Transducer) 17a and reflection electrodes 17b that are made of a metal layer such as Aluminum provided on the element substrate 12. The IDT 17a is structured with two comb-like electrodes. On the other hand, the reflection electrode 17b is located at both sides of the IDT 17a. The comb-like electrode of the IDT 17a excites an acoustic wave. The reflection electrode 17b reflects the excited acoustic wave. The propagation direction of the acoustic wave is an X-axis direction of the element substrate 12. A boundary acoustic wave device, a love wave device or the like may be used as an acoustic wave device having a comb-like electrode, in addition to the surface acoustic wave device.

Figure 2A:
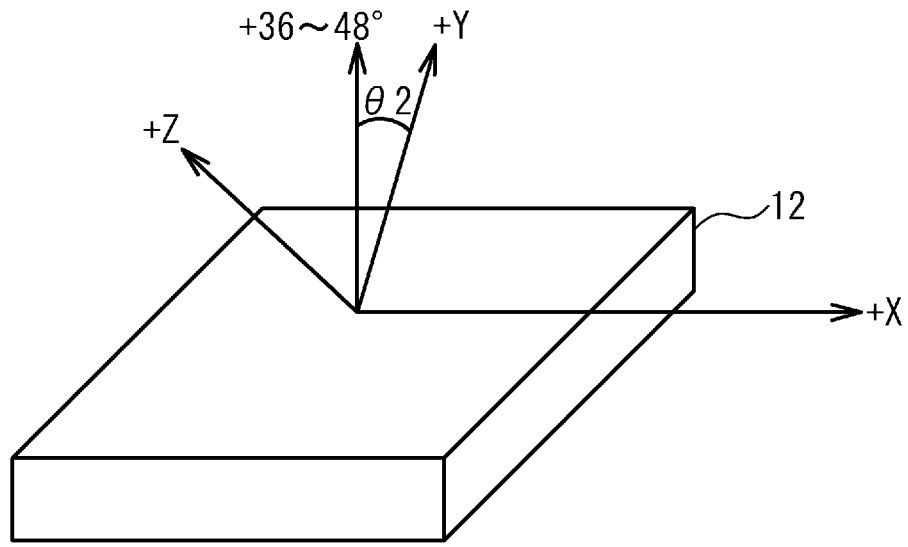
FIG. 2A and FIG. 2B illustrate an element substrate of the acoustic wave device in accordance with the first embodiment, and crystal orientation of the support substrate.
Figure 2B:
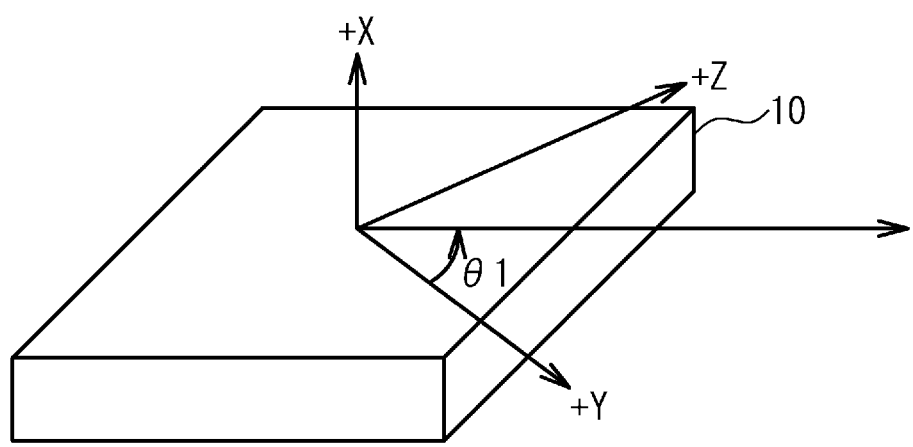

FIG. 2A illustrates a crystal orientation of the element substrate 12. FIG. 2B illustrates a crystal orientation of the support substrate 10. As illustrated in FIG. 2A, a propagation direction of an acoustic wave in the element substrate 12 is, for example, an X-axis. A normal line direction of the upper face of the element substrate 12 is a direction rotated from a Y-axis to a Z-axis by θ2 degree around the X-axis. The element substrate 12 is referred to as a lithium tantalate substrate of θ2 degrees Y-cut X-propagation. As illustrated in FIG. 2B, with respect to the support substrate 10, a normal line direction is, for example, an X-axis. A direction in parallel with the propagation direction of the acoustic wave is a direction rotated from the Y-axis to the Z-axis by θ1 degree. The support substrate 10 is referred to as a lithium tantalate substrate of X-cut θ1 degrees Y.

Figure 3A:
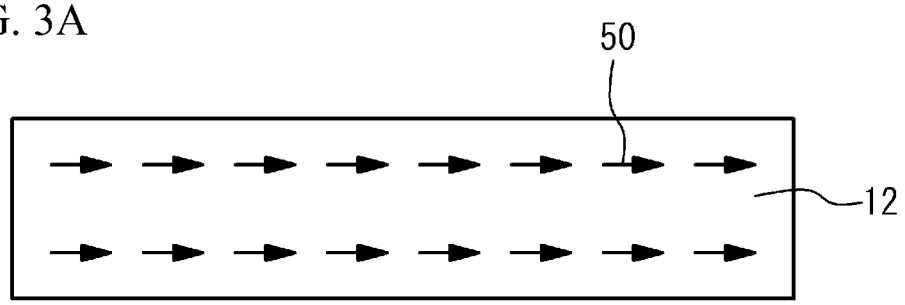
FIG. 3A and FIG. 3B illustrate a schematic view of polarization in an element substrate and a support substrate.
Figure 3B:
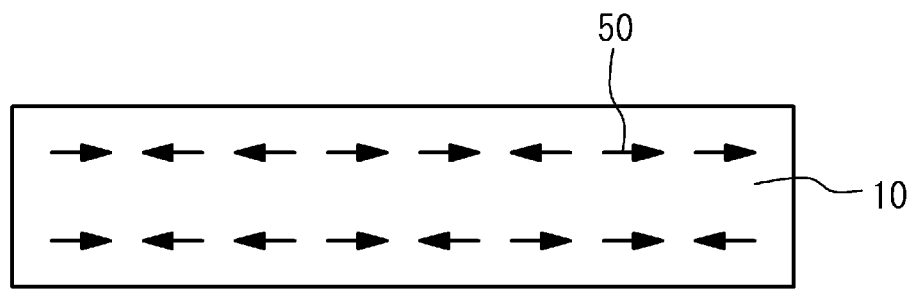

FIG. 3A illustrates a schematic view of polarization in the element substrate 12. FIG. 3B illustrates a schematic view of polarization in the support substrate 10. In FIG. 3A and FIG. 3B, the polarization direction of each domain is illustrated with an arrow 50. As illustrated in FIG. 3A, the element substrate 12 is a single crystal substrate. In the element substrate 12, the polarization directions of the domain are an identical direction. The condition is referred to as a single-polarization condition. As illustrated in FIG. 3B, although the support substrate 10 is a single crystal substrate, the polarization directions of the domain are distributed discretely. The condition is referred to as a multi-polarization condition.

When a single crystal ingot of lithium tantalate is formed through a pulling method, domains that voluntarily polarizes are arrayed in the single crystal in random order. For example, as illustrated in FIG. 3B, domains that voluntarily polarize in different directions by 180 degrees are arrayed in random order. The condition is the multi-polarization condition described above. In order to form an ingot in the single-polarization condition, a substrate in the multi-polarization condition is subjected to a single polarization treatment. The single polarization treatment is, for example, cooling an ingot gradually with a direct electric field being applied to the ingot around Curie temperature. Thus, an ingot polarized in a direct electric field direction is formed. When the ingot is cut off along a desirable direction, substrates are formed. In the first embodiment, a substrate in the multi-polarization condition that is not subjected to the single polarization treatment is used as the support substrate 10.

Figure 4A:
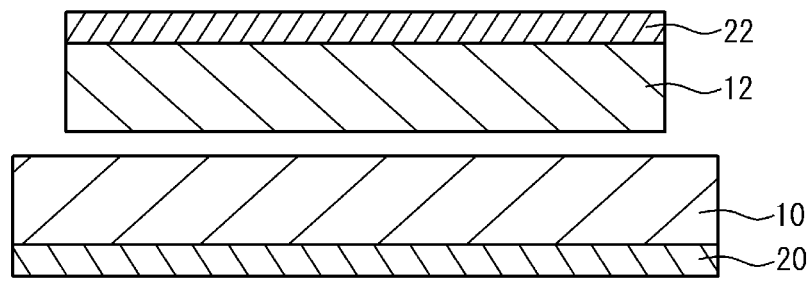
FIG. 4A through FIG. 4E illustrate a method for manufacturing the acoustic wave device in accordance with the first embodiment.

FIG. 4A through FIG. 4E illustrate a method for manufacturing the acoustic wave device in accordance with the first embodiment. First, a metal film 20 is formed on a lower face of the support substrate 10 made of lithium tantalate (LiTaO$_3$) having a wafer shape, and a metal film 22 is formed on an upper face of the element substrate 12 made of lithium tantalate (LiTaO$_3$) having a wafer shape, as illustrated in FIG. 4A. The metal films 20 and 22 are used as a conductive film for fixing the substrate to an electrostatic chuck stage in a substrate-jointing equipment. For example, titanium (Ti) or aluminum (Al) is used as the metal films 20 and 22.

Figure 4B:
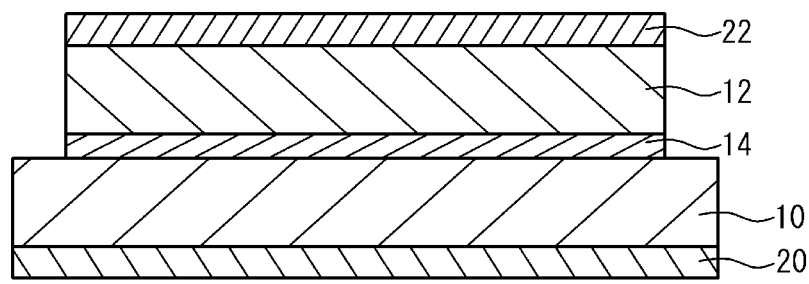
Figure 5:
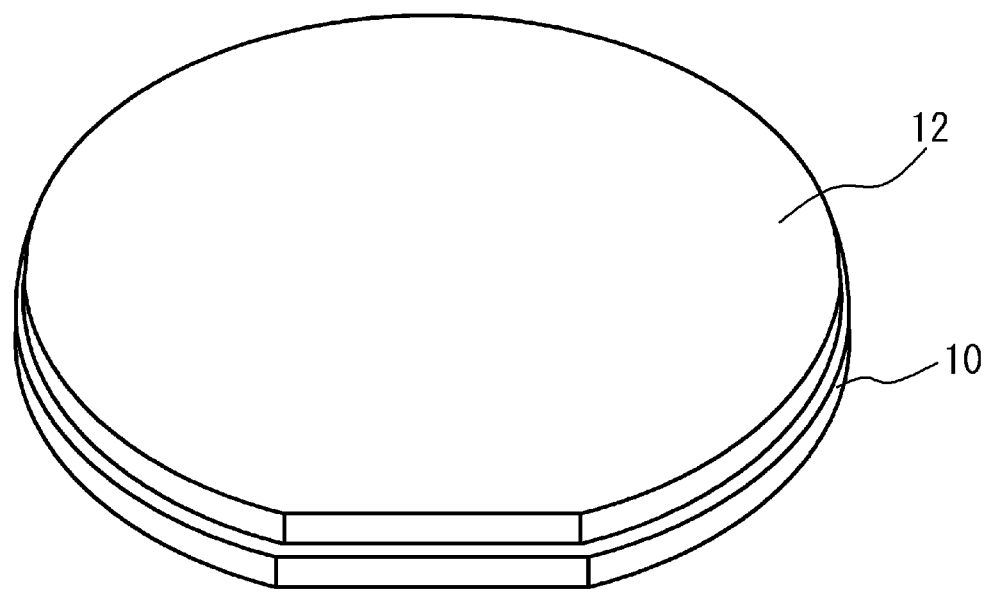
FIG. 5 illustrates a perspective view of a structure in which an element substrate is jointed to a support substrate.

Next, as illustrated in FIG. 4B, the lower face (a face on which a metal film is not provided) of the support substrate 10 is jointed to the upper face (a face on which a metal film is not provided) of the element substrate 12 at ordinary temperature. Through the jointing process at the ordinary temperature, the support substrate 10 and the element substrate 12 are jointed to each other through the amorphous layer 14. The thickness of the amorphous layer 14 is, for example, 1 nm to 8 nm. FIG. 5 illustrates a perspective view of the structure in which the element substrate is jointed to the support substrate. As illustrated in FIG. 5, the element substrate 12 is integrated with the wafer-shaped support substrate 10 through the jointing at the ordinary temperature.

Figure 4C:
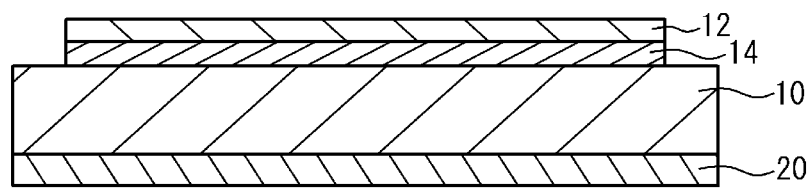

Next, the metal film 22 on the upper face of the element substrate 12 is removed. The element substrate 12 is grinded, and the thickness of the element substrate 12 is reduced to a desirable thickness as illustrated in FIG. 4C.

Figure 4D:
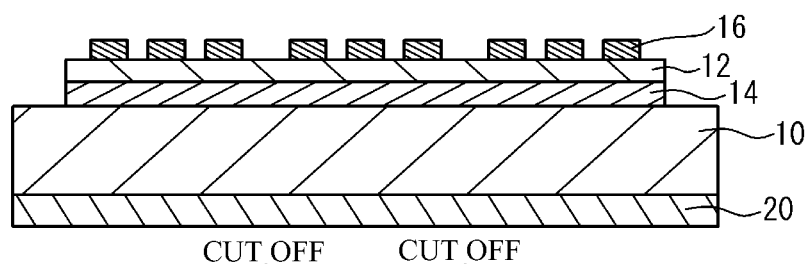

Next, as illustrated in FIG. 4D, the IDT 17a and the reflection electrode 17b made of a metal film 16 are formed on the upper face of the element substrate 12 with use of a coating technology such as a sputtering method or a vapor deposition method and a patterning technology such as a photo etching method. The metal film 16 is, for example, mainly made of aluminum (Al), and may include copper (Cu) or the like. And, a lift-off method may be used as a forming method of the IDT 17a and the reflection electrode 17b.

Figure 4E:
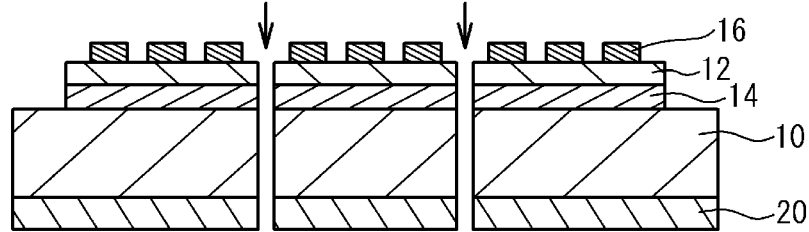

After that, the element substrate 12 and the support substrate 10 integrated with each other are cut off by a dicing method, and are separated into each acoustic wave device as illustrated in FIG. 4E. The element substrate 12 and the support substrate 10 are made of the same material. Therefore, the element substrate 12 and the support substrate 10 are cut off through a single dicing process with use of an identical dicing blade. If the element substrate 12 is jointed to another support substrate made of another material having an expansion coefficient canceling the thermal expansion of the element substrate 12, the dicing process is divided into two steps when the hardness degree of the support substrate 10 is high as in the case of sapphire. In this case, a level difference is generated on a sidewall of an element, and it is not possible to reduce an element area. In contrast, in the first embodiment, the element is cut off and is separated into a chip through a single dicing process. Therefore, the level difference is not generated on the sidewall of the chip. And it is possible to reduce the element area.

FIG. 6A through FIG. 7B illustrate a jointing method of the support substrate and the element substrate. In FIG. 6A through FIG. 7B, a numeral 26 indicates a schematic view of molecules of the materials of the substrates. Before the jointing process, the face to be subjected to the jointing process is subjected to a preprocessing in order to remove contaminations and particles. As the preprocessing, a scribing process (a surface washing with use of a brush) or a mega sonic (ultrasonic) washing is performed.

Figure 6A:
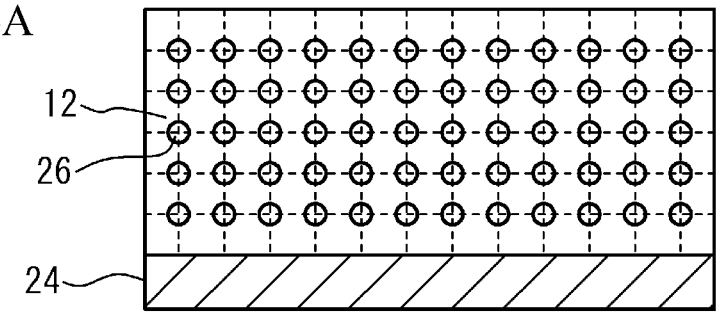
FIG. 6A and FIG. 6B illustrate a jointing method of the support substrate and the element substrate.
Figure 6A:
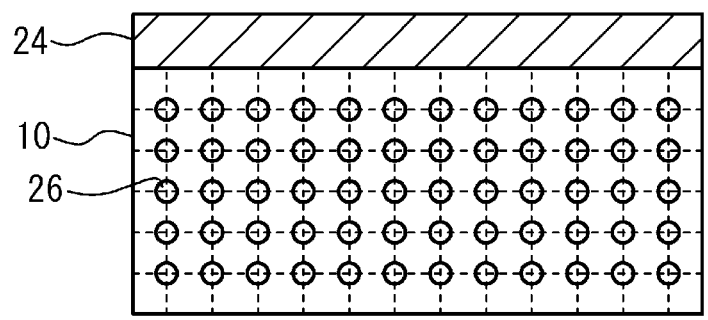

The support substrate 10 and the element substrate 12 subjected to the preprocessing are arrayed separately from each other in a processing equipment so that the faces to be jointed face each other, as illustrated in FIG. 6A.

Figure 6B:
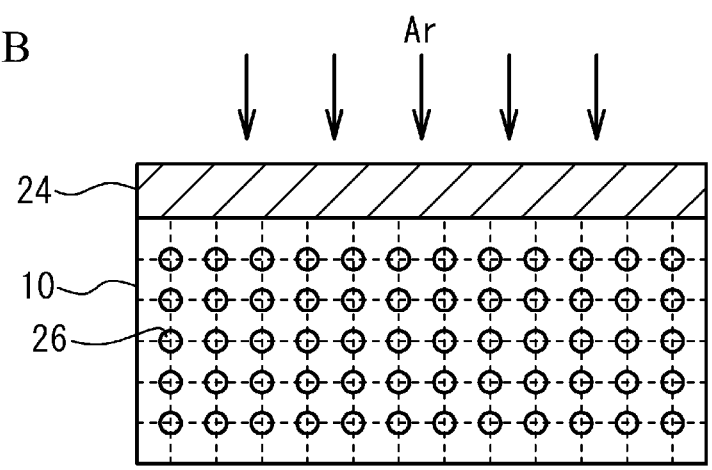

In the condition, ion beam of inert gas, neutral beam or plasma is radiated to the upper face (the face to be jointed) of the support substrate 10 and the lower face (the face to be jointed) of the element substrate 12, as illustrated in FIG. 6B. In FIG. 6B, the radiation process to the support substrate 10 is illustrated. However, the element substrate 12 is subjected to the radiation process in parallel. Thus, a surface layer 24 (such as an oxide layer) is removed from the upper face (the face to be jointed) of the support substrate 10 and the lower face (the face to be jointed) of the element substrate 12. Further, the upper face (the face to be jointed) of the support substrate 10 and the lower face (the face to be jointed) of the element substrate 12 are activated.

In the activating process, argon (Ar) is used as the inert gas, and an ion of the argon is radiated to the upper face (the face to be jointed) of the support substrate 10 and the lower face (the face to be jointed) of the element substrate 12. For example, the following conditions are selected as the radiation condition of the argon ion in a reduced pressure condition.

Figure 7A:
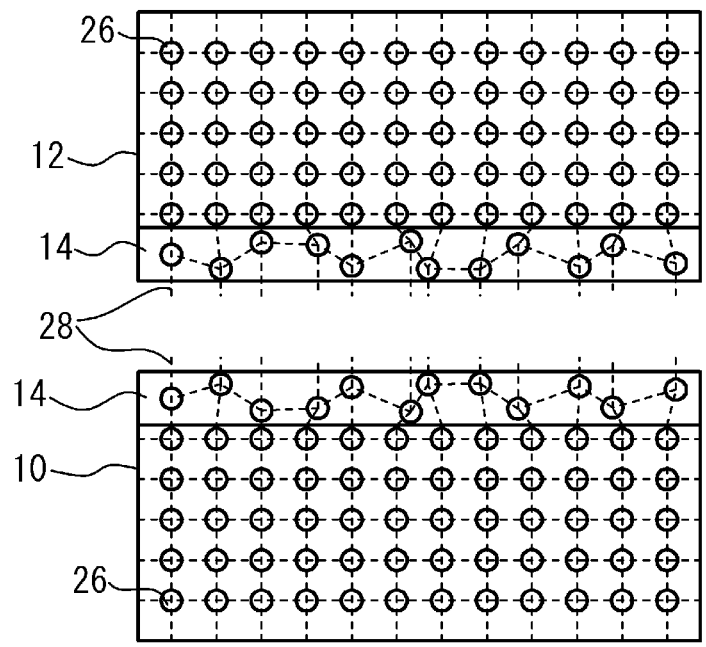
FIG. 7A and FIG. 7B illustrate a jointing method of the support substrate and the element substrate.

Flow amount of Ar gas: 20 to 30 sccm
Current value: 15 to 150 mA
Radiation time: 30 to 120 seconds Through the activating process, the amorphous layer 14 is formed on the upper face (the face to be jointed) of the support substrate 10 and the lower face (the face to be jointed) of the element substrate 12, as illustrated in FIG. 7A. The thickness of the amorphous layer 14 is a few nano meters or less. An uncombined hand 28 is formed on the surface of the amorphous layer 14. The existence of the uncombined hand 28 results in the activating of the upper face (the face to be jointed) of the support substrate 10 and the lower face (the face to be jointed) of the element substrate 12.

Figure 7B:
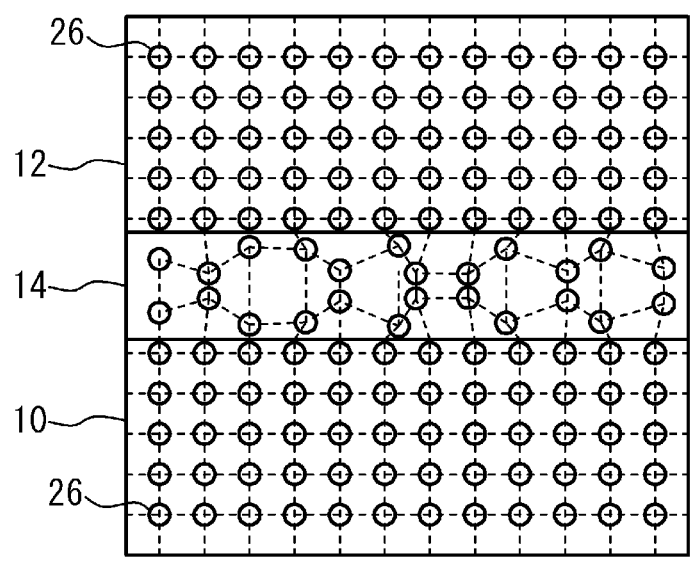

In this way, the upper face of the support substrate 10 and the lower face of the element substrate 12 are faced each other and are jointed to each other as illustrated in FIG. 7B, with the faces to be jointed being activated. The jointing process is performed in the equipment in which the radiation process of the inert gas is performed. In this case, the uncombined hand 28 of the upper face (the face to be jointed) of the support substrate 10 is combined with the uncombined hand 28 of the lower face (the face to be jointed) of the element substrate 12, because the upper face (the face to be jointed) of the support substrate 10 and the lower face (the face to be jointed) of the element substrate 12 are activated. That is, the support substrate 10 is jointed to the element substrate 12 at the ordinary temperature (for example, a temperature of 100 degrees C. or less). The amorphous layer 14 is sandwiched between the support substrate 10 and the element substrate 12 and is integrated with the support substrate 10 and the element substrate 12. The integrated amorphous layer 14 has the thickness of 1 to 8 nm or the like.

In accordance with the first embodiment, the support substrate 10 and the element substrate 12 are a lithium tantalate substrate. That is, the support substrate 10 and the element substrate 12 are made of the same material. Therefore, the support substrate 10 and the element substrate 12 have the same density. Sonic speed in the support substrate 10 is substantially the same as that in the element substrate 12. The amorphous layer 14 is made of lithium tantalate that is the same material as the support substrate 10 and the element substrate 12. The density of the amorphous layer 14 is the same as that of the support substrate 10 and the element substrate 12. Only crystal structure of the amorphous layer 14 is different from that of the support substrate 10 and the element substrate 12. Therefore, the sonic speed in the amorphous layer 14 is substantially the same as that in the support substrate 10 and the element substrate 12. As mentioned above, acoustic impedance is related to the sonic speed and the substrate density. Therefore, there is little difference between the acoustic impedance of the support substrate 10 and that of the element substrate 12. Thus, a bulk wave is poorly reflected at an interface between the support substrate 10 and the element substrate 12. Thereby, occurrence of spurious is restrained.

The linear thermal expansion coefficient in the X-axis is the largest in the crystal orientations of the lithium tantalate crystal. The linear thermal expansion coefficient in the Z-axis is the smallest in the crystal orientations of the lithium tantalate crystal. The linear thermal expansion coefficient of the X-axis and the Y-axis is 16.1 ppm/C. deg. The linear thermal expansion coefficient of the Z-axis is 4.1 ppm/C. deg.

As mentioned above, the X-axis is selected as the propagation direction of an acoustic wave in the element substrate 12, in view of the performance of the surface acoustic wave element. On the other hand, the normal line direction of the upper face of the support substrate 10 is the X-axis or the Y-axis. Thus, a linear thermal expansion coefficient of a direction in the support substrate 10 in parallel with the X-axis of the element substrate 12 can be smaller than that of the X-axis. Therefore, temperature dependence of the surface acoustic wave element formed on the element substrate 12 can be reduced, when the element substrate 12 is jointed to the support substrate 10.

In the first embodiment, the propagation direction of the acoustic wave of the element substrate 12 is not in parallel with the Z-axis of the support substrate 10. Thus, occurrence of spurious response is restrained. A difference between the linear thermal expansion coefficient in the propagation direction (X-axis) of an acoustic wave in the element substrate 12 and the linear thermal expansion coefficient in a direction in parallel with the propagation direction of an acoustic wave in the support substrate 10 can be reduced. Therefore, the deformation of the substrate is restrained.

In the first embodiment, the difference between the linear thermal expansion coefficient in the propagation direction of an acoustic wave in the element substrate 12 and the linear thermal expansion coefficient in the direction in parallel with the propagation direction of an acoustic wave in the support substrate 10 is set so that the temperature dependence of the surface acoustic wave element is suppressed, and the deformation of the substrate caused by the thermal process is restrained. Thus, the temperature dependence of the surface acoustic wave element is suppressed, and the deformation of the substrate caused by the thermal process is restrained.

In the first embodiment, the amorphous layer 14 is formed on the upper face (the face to be jointed) of the support substrate 10 and the lower face (the face to be jointed) of the element substrate 12. And, the support substrate 10 is jointed to the element substrate 12 with the amorphous layer 14 being activated. The existence of the activated amorphous layer 14 results in strong bonding between the support substrate 10 and the element substrate 12 at relatively low temperature. That is, the lower face (the face to be jointed) of the element substrate 12 can be jointed to the upper face (the face to be jointed) of the support substrate 10 at the ordinary temperature of 100 degrees C. or less. This results in the strong bonding between the faces for jointing of the substrates without thermal stress.

Figure 8:
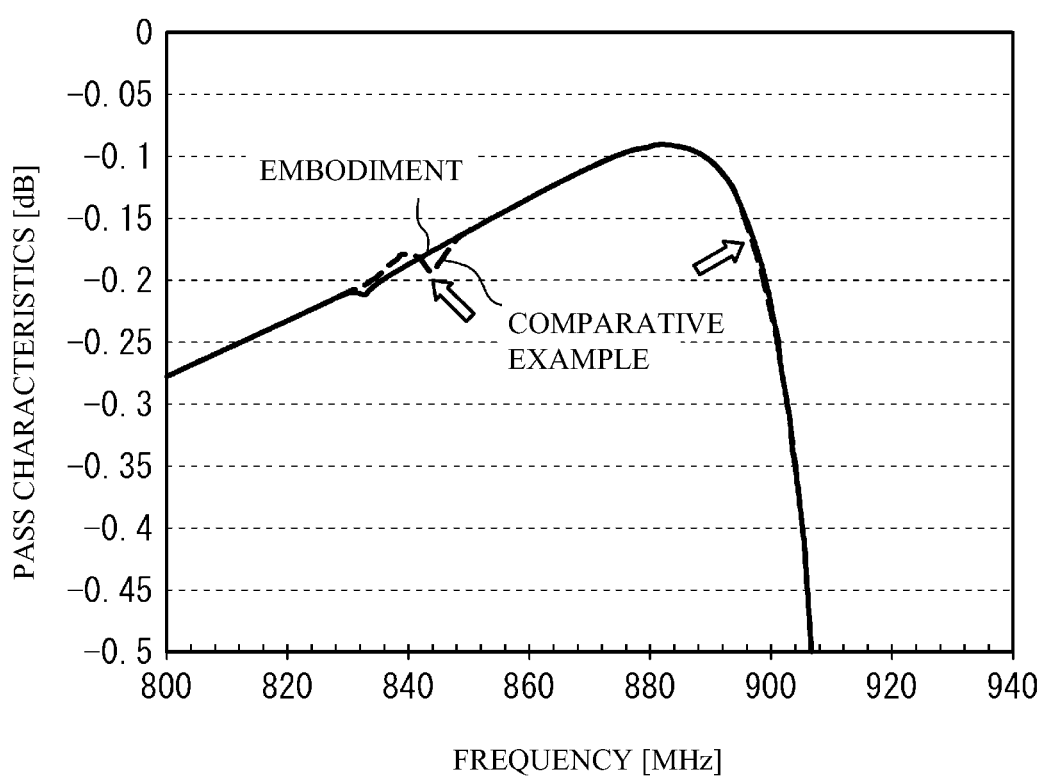
FIG. 8 illustrates pass characteristics simulation of a single-terminal-pair resonance element as an example of the acoustic wave device in accordance with the first embodiment.

FIG. 8 illustrates pass characteristics simulation result of a single-terminal-pair resonance element as an example of the acoustic wave device in accordance with the first embodiment. In FIG. 8, a solid line indicates the first embodiment in which a lithium tantalate substrate in the multi-polarization condition is used as the support substrate 10. A broken line indicates a comparative example in which a lithium tantalate substrate in the single-polarization condition is used as the support substrate 10. In the first embodiment and the comparative example, the element substrate 12 is a lithium tantalate substrate of 42 degrees Y-cut X-propagation in the single-polarization condition, and the support substrate 10 is a lithium tantalate substrate that is cut off along the X-face. The element substrate 12 is jointed to the support substrate 10 so that the X-axis of the element substrate 12 is in parallel with the Z-axis of the support substrate 10. The thickness of the element substrate 12 is 15 μm.

As illustrated in FIG. 8, in the comparative example, spurious response occurs around 840 MHz and 900 MHz (with reference to an arrow in FIG. 8). On the other hand, in the first embodiment, the spurious response does not occur.

Figure 9A:
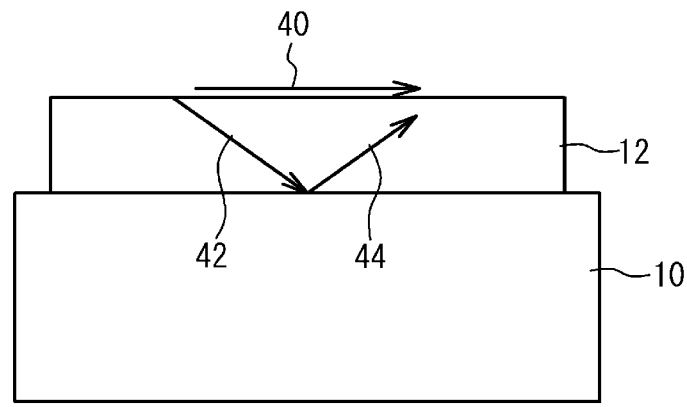
FIG. 9A through FIG. 9C illustrate occurrence of the spurious response.
Figure 9B:
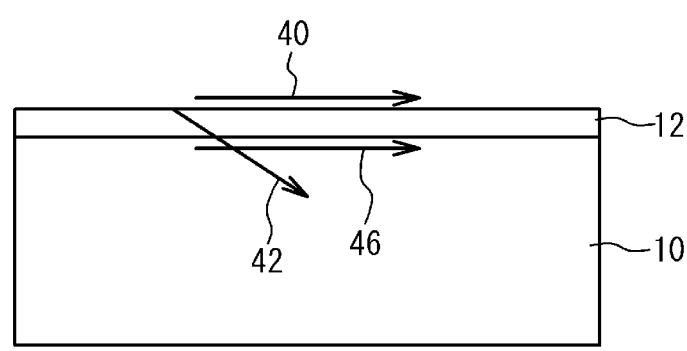
Figure 9C:
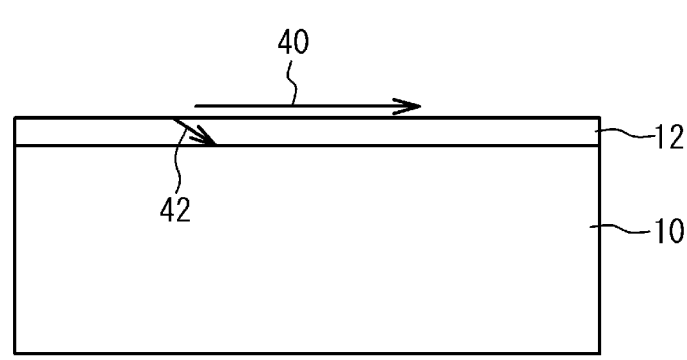

FIG. 9A through FIG. 9C illustrate the occurrence of the spurious response. In FIG. 9A, a sapphire substrate is used as the support substrate 10, and a lithium tantalate substrate in the single-polarization condition is used as the element substrate 12. A surface acoustic wave 40 is excited at the surface of the element substrate 12. The surface acoustic wave 40 is an acoustic wave of a mode used for an acoustic wave device mainly. Further, a leaky wave 42 is generated in a longitudinal direction in the element substrate 12. The leaky wave 42 is reflected at an interface between the element substrate 12 and the support substrate 10 because of the density difference and the hardness difference between the element substrate 12 and the support substrate 10, and acts as a reflected wave 44. The reflected wave 44 causes unnecessary spurious response.

FIG. 9B illustrates a schematic view of the comparative example. In the comparative example, a lithium tantalate substrate in the single-polarization condition is used as the support substrate 10, and a lithium tantalate substrate in the single-polarization condition is used as the element substrate 12. The surface acoustic wave 40 is excited at the surface of the element substrate 12. Further, the leaky wave 42 is generated in a longitudinal direction in the element substrate 12. The leaky wave 42 is not reflected at the interface between the element substrate 12 and the support substrate 10, because the density and the hardness of the element substrate 12 are the same as those of the support substrate 10. Therefore, the spurious response caused by the reflected wave 44 illustrated in FIG. 9A is restrained. However, a surface acoustic wave 46 is slightly generated at the interface between the element substrate 12 and the support substrate 10. The spurious response occurs because of the surface acoustic wave 46. The spurious response of FIG. 8 is a spurious caused by the surface acoustic wave 46.

FIG. 9C illustrates a schematic view of the first embodiment. In the first embodiment, a lithium tantalate substrate in the multi-polarization condition is used as the support substrate 10, and a lithium tantalate substrate in the single-polarization condition is used as the element substrate 12. The surface acoustic wave 40 is excited at the surface of the element substrate 12. An acoustic wave is not excited at the support substrate 10, because the support substrate 10 is in the multi-polarization condition. Therefore, the leaky wave 42 in the longitudinal direction in the element substrate 12 attenuates in the support substrate 10. Further, a surface acoustic wave is not excited at the interface between the element substrate 12 and the support substrate 10. Therefore, the spurious response caused by the surface acoustic wave 46 as in the case of the comparative example does not occur.

In accordance with the first embodiment, the support substrate 10 made of lithium tantalate in the multi-polarization condition is used. Thus, the spurious response caused by the reflected wave 44 illustrated in FIG. 9A and the surface acoustic wave 46 illustrated in FIG. 9B is restrained.

The propagation direction of the acoustic wave in the element substrate 12 is optional. However, it is preferable that the propagation direction of the acoustic wave in the element substrate 12 is in the X-axis, in order to improve the performance of the acoustic wave device. Further, the normal line direction of the upper face of the element substrate 12 is optional. However, it is preferable that the normal line direction of the upper face of the element substrate 12 is a direction that is rotated from the Y-axis to the Z-axis by 36 degrees to 48 degrees around the X-axis.

The linear thermal expansion coefficient of the X-axis is the largest, and the linear thermal expansion coefficient of the Z-axis is the smallest, in the crystal orientations in the lithium tantalate crystal. The linear thermal expansion coefficient of the X-axis and the Y-axis is 16.1 ppm/C. deg. The linear thermal expansion coefficient of the Z-axis is 4.1 ppm/deg. Therefore, the temperature dependence of the acoustic wave device gets larger when the propagation direction of the acoustic wave in the element substrate 12 is in the X-axis. For example, the temperature dependence of an operating frequency gets larger.

The direction of the support substrate 10 in parallel with the propagation direction of the acoustic wave in the element substrate 12 is optional. However, it is preferable that the linear thermal expansion coefficient of the support substrate 10 in parallel with the propagation direction of the acoustic wave in the element substrate 12 is smaller than the linear thermal expansion coefficient of the X-axis in the element substrate 12, in order to suppress the temperature dependence of the acoustic wave device when the propagation direction of the acoustic wave in the element substrate 12 is in the X-axis. Thus, the temperature dependence of the acoustic wave device is suppressed.

Further, the normal line direction of the upper face of the support substrate 10 is optional. However, the normal line direction of the upper face of the support substrate 10 is the X-axis or the Y-axis. Thus, the linear thermal expansion coefficient of the direction of the support substrate 10 in parallel with the X-axis of the element substrate 12 can be smaller than that of the X-axis.

Further, the propagation direction of the acoustic wave in the element substrate 12 is not in parallel with the Z-axis of the support substrate 10. The difference between the linear thermal expansion coefficient in the propagation direction (the X-axis direction) of the acoustic wave in the element substrate 12 and the linear thermal expansion coefficient in the direction in parallel with the propagation direction of the acoustic wave in the support substrate 10 can be reduced. Therefore, the deformation caused by a large difference between the linear thermal expansion coefficient of the element substrate 12 and the linear thermal expansion coefficient of the support substrate 10 is restrained.

As mentioned above, the difference between the linear thermal expansion coefficient of the propagation direction of the acoustic wave in the element substrate 12 and the linear thermal expansion coefficient in the direction in parallel with the propagation direction of the acoustic wave in the support substrate 10 is set so that the temperature dependence of the acoustic wave device is suppressed, and the deformation of the substrate caused by the thermal process is restrained. Thus, the temperature dependence of the surface acoustic wave element is suppressed, and the deformation of the substrate caused by the thermal process is restrained.

In the case of the comparative example, if the propagation direction of the acoustic wave in the element substrate 12 is in the X-axis, the spurious caused by the surface acoustic wave 46 of FIG. 9B occurs greatly when the direction of the support substrate 10 in parallel with the X-axis in the element substrate 12 is the Z-axis. In accordance with the first embodiment, the orientation of the support substrate 10 can be selected, without considering an orientation in which the spurious caused by the surface acoustic wave 46 tends to occur.

It is preferable that the element substrate 12 is thin, in order to suppress the temperature dependence of frequency of the acoustic wave device. However, in the comparative example, when the element substrate 12 is thin, the spurious caused by the surface acoustic wave 46 tends to occur. However, in accordance with the first embodiment, the thickness of the element substrate 12 can be reduced, without considering the spurious. The element substrate 12 may be thinner than the support substrate 10.

Second Embodiment

Figure 10:
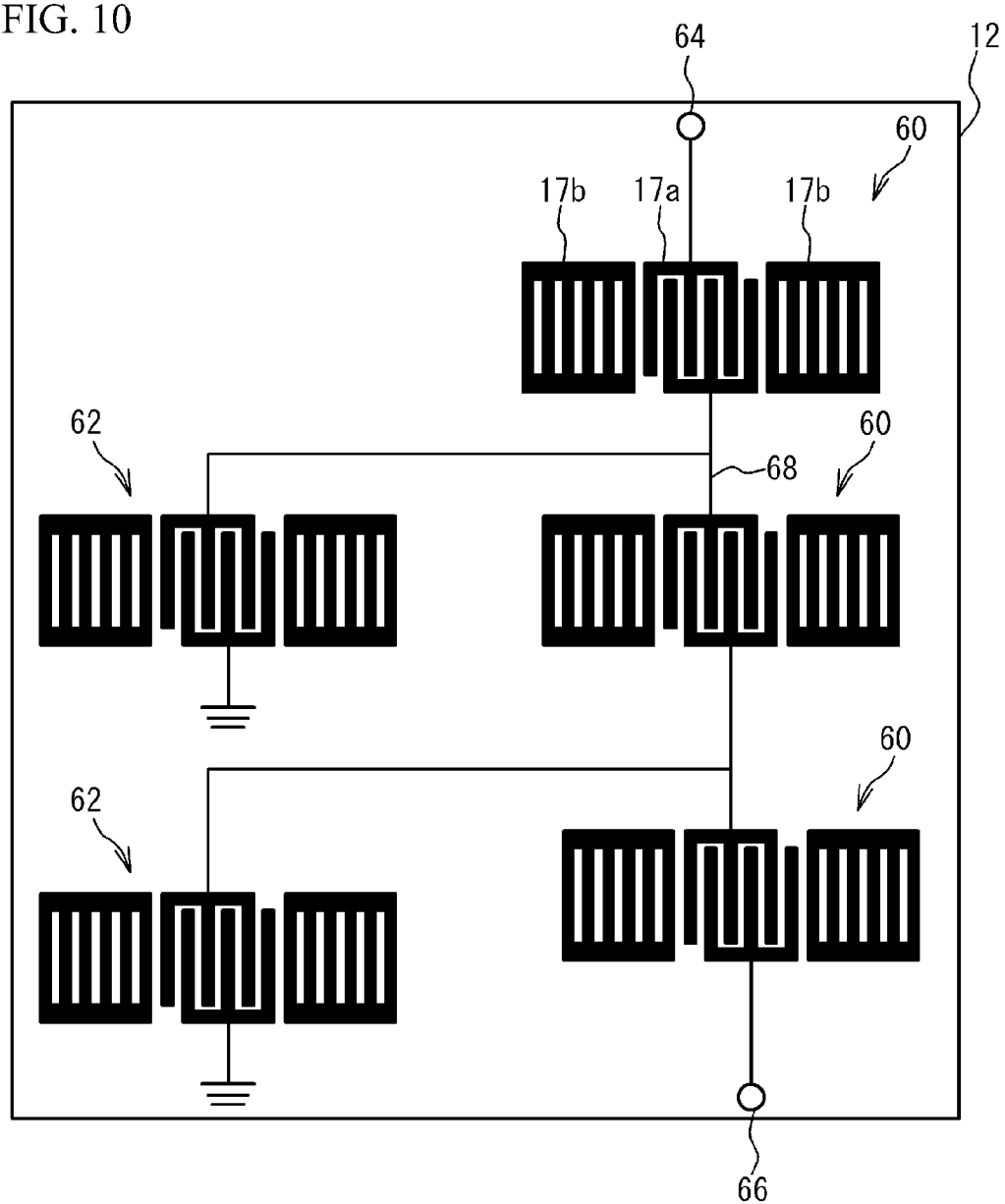
FIG. 10 illustrates a schematic top view of a filter in accordance with a second embodiment.

A second embodiment is an example of a ladder type filter having the single-terminal-pair resonator described in the first embodiment. FIG. 10 illustrates a schematic top view of a filter in accordance with the second embodiment. As illustrated in FIG. 10, a plurality of resonators 60 and a plurality of resonators 62 are provided on the element substrate 12. The resonators 60 and 62 have the IDT 17a and the reflection electrode 17b. The resonators 60 and the resonators 62 are electrically connected to each other via an interconnection line 68 made of a metal provided on the element substrate 12. The series resonators 60 are electrically connected in series between an input terminal 64 and an output terminal 66. The parallel resonators 62 are electrically connected in parallel between the input terminal 64 and the output terminal 66.

As in the case of the second embodiment, the single-terminal-pair resonator of the first embodiment can be used as the ladder type filter. In the ladder type filter, the spurious generated in the series resonators 60 and/or the parallel resonators 62 overlaps with each other, and make a ripple of a pass band. Therefore, in the second embodiment, the ripple of the pass band is suppressed. The first embodiment can be applied to another filter such as a multiple mode type filter other than the ladder type filter.

Third Embodiment

Figure 11:
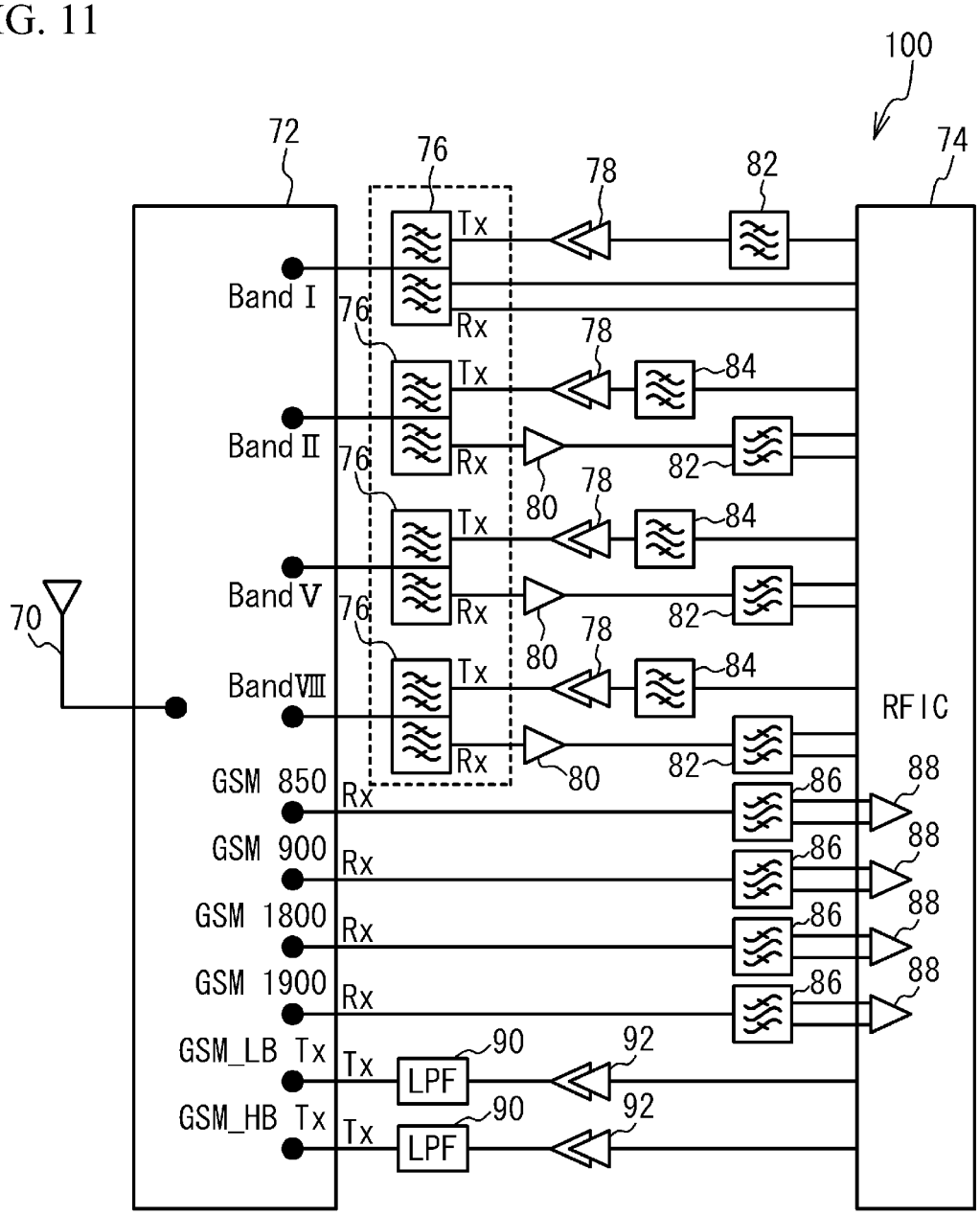
FIG. 11 illustrates a block diagram of a module in accordance with a third embodiment.

A third embodiment is an example where the acoustic wave device of the first embodiment or the second embodiment is used in a module. FIG. 11 illustrates a block diagram of a module 100 in accordance with the third embodiment. As illustrated in FIG. 11, the module 100 has an RF (Radio Frequency) switch 72, an RFIC (Integrated Circuit) 74, a duplexer 76, power amplifiers 78 and 92, a low noise amplifier 80, band pass filters 82, 84 and 86 and a low pass filter 90. The module 100 is a communication module for a mobile phone unit that is capable of transmitting and receiving in Band I, Band II, Band V and Band VIII of WCDMA (Wideband Code Division Multiple Access) and 850 MHz band, 900 MHz band, 1800 MHz band and 1900 MHz band of GSM (Global System for Mobile Communication).

The RF switch 72 switches between an antenna 70 and each terminal. The terminal subjected to the switching is a common terminal of Band I to Band VIII (Band I, Band II, Band V and Band VIII), a receiving terminal of each GSM frequency band (GSM 850, GSM 950, GSM 1800 and GSM 1900), a transmitting terminal (GSM_LB Tx) of a low frequency band of the GSM (850 MHz and 950 MHz) and a transmitting terminal (GSM_HB Tx) of a high frequency band of the GSM (1800 MHz and 1900 MHz).

A description will be given of transmitting and receiving of a transmitting signal and a receiving signal of the WCDMA. The RFIC 74 up-converts a transmitting signal of a base band of the WCDMA into a transmitting signal of high frequency, and outputs the up-converted signal to the filter 84. The filter 84 filters the transmitting signal and outputs the filtered signal to the power amplifier 78. The power amplifier 78 amplifies the transmitting signal, and outputs the amplified signal to a transmitting terminal Tx of the duplexer 76. The duplexer 76 filters the transmitting signal and outputs the filtered signal to the corresponding common terminal (Band I, Band II, Band V and Band VIII) of the RF switch 72. The RF switch 72 outputs the receiving signal to the common terminal (Band I, Band II, Band V and Band VIII). The duplexer 76 filters the receiving signal and outputs the filtered signal to the low noise amplifier 80 from a receiving terminal Rx. The low noise amplifier 80 amplifies the receiving signal and outputs the amplified signal to the filter 82. The filter 82 filters the receiving signal and outputs the filtered signal to the RFIC 74. The filter 82 may output a balanced signal.

The RFIC 74 down-converts a receiving signal of high frequency into a receiving signal of base band. The duplexer 76 allows passing of a transmitting signal input to the transmitting terminal Tx to the common terminal. However, the duplexer 76 does not output a receiving signal input to the common terminal to the transmitting terminal Tx. The duplexer 76 allows passing of a receiving signal input to the common terminal to the receiving terminal. However, the duplexer 76 does not output the transmitting signal input to the transmitting terminal Tx to the receiving terminal Rx.

A description will be given of transmitting and receiving of a transmitting signal and a receiving signal of the GSM. The RFIC 74 up-converts a transmitting signal of the base band frequency of the GSM into a transmitting signal of high frequency, and outputs the up-converted signal to the power amplifier 92. The power amplifier 92 amplifies the transmitting signal, and outputs the amplified signal to the low pass filter 90. The low pass filter 90 filters the transmitting signal, and outputs the filtered signal to the transmitting terminal Tx of the RF switch 72. A transmitting signal of 850 MHz band and a transmitting signal of 950 MHz band are input to the identical transmitting terminal GSM_LB Tx. A transmitting signal of 1800 MHz band and a transmitting signal of 1900 MHz band are input to the identical transmitting terminal GSM_HB Tx. The RF switch 72 outputs the receiving signal to the receiving terminal Rx. The filter 86 filters the receiving signal, and outputs the filtered signal to the RFIC 74. The filter 86 may output a balanced signal. The RFIC 74 has a low noise amplifier 88. The low noise amplifier 88 amplifies the receiving signal. The RFIC 74 down-converts the amplified receiving signal of high frequency into the receiving signal of the base band frequency.

The acoustic wave device of the first embodiment or the second embodiment may be used as at least one of the duplexer 76, the band pass filters 82, 84 and 86 of the module 100 in accordance with the third embodiment. In the third embodiment, the communication module for a mobile phone unit is described. However, the acoustic wave device of the first embodiment or the second embodiment may be used as another module.

The present invention is not limited to the specifically described embodiments, but other embodiments and variations may be made without departing from the scope of the claimed invention.

What is claimed is:

1. An acoustic wave device, comprising:
   a support substrate composed of lithium tantalate in multi-polarization condition;
   an element substrate that is provided on an upper face of the support substrate and is composed of lithium tantalate, a lower face of the element substrate being joined to the upper face of the support substrate; and
   a comb-like electrode that is provided on an upper face of the element substrate and excites an acoustic wave,
   wherein domains that voluntarily polarizes are arrayed in the support substrate in random order.

2. The acoustic wave device as claimed in claim 1 further comprising an amorphous layer between the upper face of the support substrate and the lower face of the element substrate.

3. The acoustic wave device as claimed in claim 1, wherein the lower face of the element substrate is joined to the upper face of the support substrate at ordinary temperature.

4. The acoustic wave device as claimed in claim 1, wherein a normal direction of the upper face of the element substrate is a direction rotated from a Y-axis to a Z-axis by 36 degrees to 48 degrees around an X-axis.

5. The acoustic wave device as claimed in claim 1, wherein the element substrate is thinner than the support substrate.

6. The acoustic wave device as claimed in claim 1, wherein the comb-like electrode excites the acoustic wave at a surface of the element substrate and does not excite the acoustic wave at the support substrate.

7. An acoustic wave device, comprising:
   a support substrate composed of lithium tantalate in multi-polarization condition;
   an element substrate that is provided on an upper face of the support substrate and is composed of lithium tantalate, a lower face of the element substrate being joined to the upper face of the support substrate; and
   a comb-like electrode that is provided on an upper face of the element substrate and excites an acoustic wave,
   wherein a linear thermal expansion coefficient of the support substrate in parallel with a propagation direction of the acoustic wave is smaller than a linear thermal expansion coefficient of the support substrate in an X-axis.

8. An acoustic wave device, comprising:
   a support substrate composed of lithium tantalate in multi-polarization condition;
   an element substrate that is provided on an upper face of the support substrate and is composed of lithium tantalate, a lower face of the element substrate being joined to the upper face of the support substrate; and
   a comb-like electrode that is provided on an upper face of the element substrate and excites an acoustic wave,
   wherein a sidewall of the acoustic wave device separated into a chip has no difference in level.

9. A module, comprising
   an acoustic wave device having a support substrate, an element substrate and a comb-like electrode,
   the support substrate being composed of lithium tantalate in multi-polarization condition,
   the element substrate being provided on an upper face of the support substrate and being composed of lithium tantalate,
   a lower face of the element substrate being joined to the upper face of the support substrate,
   the comb-like electrode being provided on an upper face of the element substrate and exciting an acoustic wave,
   wherein domains that voluntarily polarizes are arrayed in the support substrate in random order.

* * * * *